(12) United States Patent
Kim et al.

(10) Patent No.: US 11,948,851 B2
(45) Date of Patent: Apr. 2, 2024

(54) SEMICONDUCTOR PACKAGE INCLUDING HIGH THERMAL CONDUCTIVITY LAYER

(71) Applicant: Samsung Electronics Co., Ltd., Suwon-si (KR)

(72) Inventors: Sunjae Kim, Seoul (KR); Eunsil Kang, Suwon-si (KR); Daehyun Kim, Suwon-si (KR); Sunkyoung Seo, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 17/332,471

(22) Filed: May 27, 2021

(65) Prior Publication Data
US 2022/0173008 A1     Jun. 2, 2022

(30) Foreign Application Priority Data

Nov. 30, 2020 (KR) .................. 10-2020-0163646

(51) Int. Cl.
*H01L 23/31* (2006.01)
*H01L 23/00* (2006.01)
(Continued)

(52) U.S. Cl.
CPC ........ *H01L 23/3192* (2013.01); *H01L 23/295* (2013.01); *H01L 23/3128* (2013.01); *H01L 23/3185* (2013.01); *H01L 23/49827* (2013.01); *H01L 24/16* (2013.01); *H01L 24/17* (2013.01); *H01L 24/73* (2013.01); *H01L 24/94* (2013.01);
(Continued)

(58) Field of Classification Search
CPC ....... H01L 21/561–565; H01L 23/3107; H01L 23/3135; H01L 23/3157; H01L 23/3185; H01L 23/3192; H01L 24/93; H01L 24/94; H01L 24/96; H01L 24/97; H01L 2924/1811–18162; H01L 23/363; H01L 23/373; H01L 23/3733; H01L 23/3736–3738; H01L 2224/06519; H01L 2224/17519; H01L 2225/06589
See application file for complete search history.

(56) References Cited

U.S. PATENT DOCUMENTS

| | | | |
|---|---|---|---|
| 5,864,178 A * | 1/1999 | Yamada | H01L 24/32 257/E23.125 |
| 6,265,784 B1 * | 7/2001 | Kawano | H01L 24/32 257/781 |

(Continued)

FOREIGN PATENT DOCUMENTS

| | | |
|---|---|---|
| KR | 10-1630769 B1 | 6/2016 |
| KR | 10-1719636 B1 | 4/2017 |
| KR | 10-2084540 B1 | 3/2020 |

*Primary Examiner* — Marcos D. Pizarro
*Assistant Examiner* — William H Anderson
(74) *Attorney, Agent, or Firm* — Harness, Dickey & Pierce, P.L.C.

(57) ABSTRACT

A semiconductor package includes a first semiconductor chip on a wiring structure, a plurality of internal terminals between the wiring structure and the first semiconductor chip; a high thermal conductivity layer is between the wiring structure and the first semiconductor chip; and an encapsulator on the high thermal conductivity layer and contacting the second semiconductor chip. Sidewalls of at least the wiring structure and the encapsulator are substantially coplanar.

19 Claims, 8 Drawing Sheets

(51) Int. Cl.
*H01L 23/29* (2006.01)
*H01L 23/498* (2006.01)
*H01L 25/065* (2023.01)
*H01L 25/18* (2023.01)
*H01L 21/56* (2006.01)

(52) U.S. Cl.
CPC .......... *H01L 24/97* (2013.01); *H01L 25/0657* (2013.01); *H01L 25/18* (2013.01); *H01L 21/561* (2013.01); *H01L 24/02* (2013.01); *H01L 24/05* (2013.01); *H01L 24/13* (2013.01); *H01L 2224/02331* (2013.01); *H01L 2224/02372* (2013.01); *H01L 2224/02381* (2013.01); *H01L 2224/0557* (2013.01); *H01L 2224/06519* (2013.01); *H01L 2224/13024* (2013.01); *H01L 2224/16145* (2013.01); *H01L 2224/16146* (2013.01); *H01L 2224/16235* (2013.01); *H01L 2224/17181* (2013.01); *H01L 2224/17519* (2013.01); *H01L 2224/2929* (2013.01); *H01L 2224/29386* (2013.01); *H01L 2224/29499* (2013.01); *H01L 2224/73204* (2013.01); *H01L 2225/06513* (2013.01); *H01L 2225/06541* (2013.01); *H01L 2225/06568* (2013.01); *H01L 2225/06589* (2013.01); *H01L 2924/181* (2013.01); *H01L 2924/1815* (2013.01); *H01L 2924/18161* (2013.01)

(56) References Cited

U.S. PATENT DOCUMENTS

| | | | |
|---|---|---|---|
| 6,534,858 B2 | 3/2003 | Akram et al. | |
| 8,274,143 B2 | 9/2012 | Fujishima et al. | |
| 8,604,615 B2 | 12/2013 | Lee et al. | |
| 8,803,332 B2 | 8/2014 | Lee et al. | |
| 9,153,520 B2 | 10/2015 | Groothuis et al. | |
| 9,159,640 B2 | 10/2015 | Sugaya | |
| 9,165,916 B2 | 10/2015 | Chung et al. | |
| 9,337,119 B2 | 5/2016 | Vadhavkar et al. | |
| 9,343,432 B2 | 5/2016 | Lee et al. | |
| 10,340,156 B2 | 7/2019 | Kim et al. | |
| 2008/0251913 A1* | 10/2008 | Inomata | H01L 24/32 257/737 |
| 2009/0197370 A1* | 8/2009 | Katsura | H01L 21/563 257/E21.511 |
| 2011/0084384 A1* | 4/2011 | Sakata | H01L 24/83 257/737 |
| 2012/0211885 A1* | 8/2012 | Choi | H01L 25/105 257/737 |
| 2014/0239478 A1* | 8/2014 | Hong | H01L 25/0657 257/698 |
| 2015/0332984 A1* | 11/2015 | Kawate | H01L 21/561 252/76 |
| 2019/0244833 A1 | 8/2019 | Kim et al. | |
| 2021/0151410 A1* | 5/2021 | Hwang | H01L 25/0657 |
| 2021/0193552 A1* | 6/2021 | Wan | H01L 23/3121 |

* cited by examiner

SEMICONDUCTOR PACKAGE INCLUDING HIGH THERMAL CONDUCTIVITY LAYER

CROSS-REFERENCE TO THE RELATED APPLICATION

This non-provisional patent application claims priority from Korean Patent Application No. 10-2020-0163646, filed on Nov. 30, 2020, in the Korean Intellectual Property Office, the disclosure of which is incorporated herein by reference in its entirety.

BACKGROUND

1. Field

The example embodiments of the disclosure relate to a semiconductor package including a high thermal conductivity layer and a formation method thereof.

2. Description of the Related Art

To cope with lightness, thinness, simplification, and miniaturization demands for electronic systems, research on various semiconductor packages capable of mounting a plurality of semiconductor chips is being conducted. Each of the plurality of semiconductor chips may generate heat of a higher temperature than a surrounding environment. Heat generated from the plurality of semiconductor chips may cause malfunctions in the electronic system and/or adversely affect the lifespan of the electronic system.

SUMMARY

Some example embodiments of the disclosure provide a semiconductor package having efficient heat dissipation characteristics and a formation method thereof.

A semiconductor package according to some example embodiments of the disclosure includes a wiring structure; a first semiconductor chip on the wiring structure; a plurality of internal terminals is between the wiring structure and the first semiconductor chip; a high thermal conductivity layer between the wiring structure and the first semiconductor chip; and an encapsulator on the high thermal conductivity layer and contacting the second semiconductor chip. Sidewalls of at least the wiring structure and the encapsulator are substantially coplanar.

A semiconductor package according to some example embodiments of the disclosure includes a wiring structure including an active region and a plurality of scribe lanes in continuity with side surfaces of the active region; a semiconductor chip is on the wiring structure; a plurality of internal terminals between the wiring structure and the semiconductor chip; a high thermal conductivity layer between the wiring structure and the semiconductor chip and contacting the active region and the plurality of scribe lanes; and an encapsulator on the wiring structure and the high thermal conductivity layer and contacting the semiconductor chip is provided.

A semiconductor package according to some example embodiments of the disclosure includes a wiring structure; a semiconductor chip on the wiring structure; a plurality of internal terminals between the wiring structure and the semiconductor chip; a high thermal conductivity layer between the wiring structure and the semiconductor chip and an encapsulator on the high thermal conductivity layer and contacting the semiconductor chip. Sidewalls of at least the wiring structure and the encapsulator are substantially coplanar. An uppermost end of the high thermal conductivity layer is at a higher level than a lowermost end of the semiconductor chip. The uppermost end of the high thermal conductivity layer is at a lower level than an uppermost end of the semiconductor chip. The high thermal conductivity layer directly contacts a side surface of the semiconductor chip. The maximum contact height between the high thermal conductivity layer and the semiconductor chip is a first length. The thickness of the semiconductor chip is a second length. The first length is greater than half of the second length.

DETAILED DESCRIPTION OF EXEMPLARY EMBODIMENTS

Figure 1:
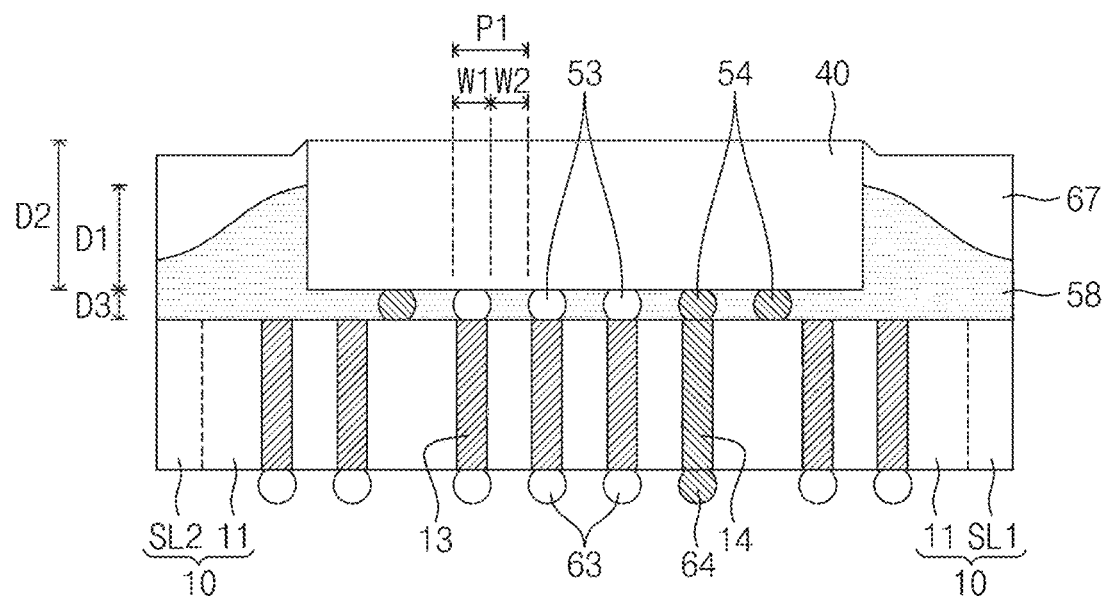
FIGS. 1 to 8 are sectional views of a semiconductor package according to some embodiments of the disclosure.

One or more example embodiments will be described in detail with reference to the accompanying drawings. Example embodiments, however, may be embodied in various different forms, and should not be construed as being limited to only the illustrated embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another element, component, region, layer, or section. Thus, a first element, component, region, layer, or section, discussed below may be termed a second element, component, region, layer, or section, without departing from the scope of this disclosure.

Spatially relative terms, such as "below," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

When the terms "about" or "substantially" are used in this specification in connection with a numerical value, it is intended that the associated numerical value includes a manufacturing tolerance (e.g., ±10%) around the stated numerical value. Moreover, when the words "similar" and "substantially" are used in connection with composition and/or geometric shapes, it is intended that precision of composition and/or the geometric shape is not required but that latitude for the composition and/or shape is within the scope of the disclosure. It will be understood that these values, compositions, and shapes should be construed as including a manufacturing or operational tolerance (e.g., ±10%) around the stated numerical values, compositions, or shapes.

FIGS. 1 to 8 are sectional views of a semiconductor package according to some embodiments of the disclosure.

Referring to FIG. 1, the semiconductor package according to some embodiments may include a wiring structure 10, a first semiconductor chip 40, a plurality of first internal terminals 53, a plurality of internal heat dispersion terminals 54, a first high thermal conductivity layer 58, a plurality of external terminals 63, at least one external heat dispersion terminal 64, and an encapsulator 67.

In some embodiments, the wiring structure 10 may be and/or include a semiconductor chip (not illustrated) such as a logic chip, a buffer chip, a controller chip, an application processor chip, an interposer chip, a volatile memory chip, a non-volatile memory chip, and/or a combination thereof. The wiring structure 10 may include a printed circuit board, an interposer substrate, the semiconductor chip, and/or a combination thereof. For convenience of description, the following description will be given in conjunction with the case in which the wiring structure 10 is a logic chip.

In some embodiments, the first semiconductor chip 40 may be and/or include a memory chip, a logic chip, a buffer chip, a controller chip, an application processor chip, an interposer chip, and/or a combination thereof. For example, the first semiconductor chip 40 may include a volatile memory chip, a non-volatile memory chip, and/or a combination thereof. For convenience of description, the following description will be given in conjunction with the case in which the first semiconductor chip 40 is a memory chip.

The wiring structure 10 may include an active region 11 and a plurality of scribe lanes SL1 and SL2. For example, the plurality of scribe lanes may include a first scribe lane SL1 and a second scribe lane SL2. The plurality of scribe lanes SL1 and SL2 may be in continuity with side surfaces of the active region 11, respectively. For example, the first scribe lane SL1 and the second scribe land SL2 may each be in contact with and/or define a respective edge of the active region 11. The active region 11 may be disposed between the plurality of scribe lanes SL1 and SL2. In some embodiments, the active region 11 and the plurality of scribe lanes SL1 and SL2 may include a semiconductor layer such as a monocrystalline silicon layer.

A plurality of first through electrodes 13 and at least one first heat dispersion through electrode 14 may be disposed in the active region 11. The plurality of first through electrodes 13 and the at least one first heat dispersion through electrode 14 may be spaced apart from one another. Each of the plurality of first through electrodes 13 and the at least one first heat dispersion through electrode 14 may extend vertically through the active region 11. The plurality of first through electrodes 13 and the at least one first heat dispersion through electrode 14 may include a conductive material such as a metal (e.g., Cu, W, Ni, Co, Al, Ti, Ta, Ag, Pt, Au, Ru, Cr, Sn, and/or a combination thereof); a conductive oxide; a conductive nitride (e.g., WN, TiN, TaN, and/or a combination thereof); and/or a combination thereof. The conductive material may be electrically and/or thermally conductive. The at least one first heat dispersion through electrode 14 may include a material substantially identical to that of the plurality of first through electrodes 13. For example, the at least one first heat dispersion through electrode 14 may be formed at substantially the same time and/or under the same conditions as the plurality of first through electrodes 13. The at least one first heat dispersion through electrode 14 may have substantially the same size as each of the plurality of first through electrodes 13. In some embodiments, the at least one first heat dispersion through electrode 14 may be omitted.

The plurality of external terminals 63 and the at least one external heat dispersion terminal 64 may be disposed on a lower surface of the active region 11. Each of the plurality of external terminals 63 may be electrically connected to a corresponding one of the plurality of first through electrodes 13. The at least one external heat dispersion terminal 64 may be electrically connected to the at least one first heat dispersion through electrode 14.

The plurality of external terminals 63 may include a conductive material such as a metal (e.g., Sn, Ag, Cu, W, Ni, Co, Al, Ti, Ta, Pt, Au, Ru, Cr, and/or a combination thereof); a conductive oxide; a conductive nitride (e.g., WN, TiN, TaN, and/or a combination thereof); and/or a combination thereof. Each of the plurality of external terminals 63 may include a conductive bump, a conductive post, a conductive pin, a conductive pillar, a solder ball, and/or a combination thereof. The at least one external heat dispersion terminal 64 may include a configuration similar to that of each of the plurality of external terminals 63. In some embodiments, the at least one external heat dispersion terminal 64 may include a material substantially identical to that of the plurality of external terminals 63. For example, the at least one external heat dispersion terminal 64 may be formed at substantially the same time and/or under the same conditions as the plurality of external terminals 63. The at least one external heat dispersion terminal 64 may have substantially the same size as each of the plurality of external terminals 63. In some embodiments, the at least one external heat dispersion terminal 64 may be omitted, for example in the example embodiments wherein the at least one first heat dispersion through electrode 14 is omitted.

The first semiconductor chip 40 may be disposed on the wiring structure 10. The horizontal width of the first semiconductor chip 40 may be smaller than the horizontal width of the wiring structure 10. The plurality of first internal terminals 53 and the plurality of first internal heat dispersion terminals 54 may be disposed between the first semiconductor chip 40 and the wiring structure 10. A portion of the first high terminal conductivity layer 58 may be disposed between the wiring structure 10 and the first semiconductor chip 40. A portion of the first high thermal conductivity layer 58 may cover an upper surface of the wiring structure 10. The first high thermal conductivity layer 58 may partially cover side surfaces of the first semiconductor chip 40. Each of the plurality of first internal terminals 53 and the plurality of first internal heat dispersion terminals 54 may extend through the first high thermal conductivity layer 50 and, as such, may contact the wiring structure 10 and/or the first semiconductor chip 40.

The plurality of first internal terminals 53 may include a conductive material such as a metal (e.g., Sn, Ag, Cu, W, Ni, Co, Al, Ti, Ta, Pt, Au, Ru, Cr, and/or a combination thereof); a conductive oxide; a conductive nitride (e.g., WN, TiN, TaN, and/or a combination thereof); and/or a combination thereof. Each of the plurality of first internal terminals 53 may include a conductive bump, a conductive post, a conductive pin, a conductive pillar, a solder ball, and/or a combination thereof. Each of the plurality of first internal terminals 53 may be connected to a corresponding one of the plurality of first through electrodes 13.

The plurality of first internal terminals 53 may be disposed to have a first pitch P1. The maximum horizontal width of each of the plurality of first internal terminals 53 may be a first width W1. In some embodiments, the first width W1 may be a width (e.g., an average and/or a representative) of the first internal terminal 53 at the center of the first internal terminal 53, and/or may correspond to the largest diameter of the first internal terminal 53. The minimum distance between the first internal terminals 53 may be a second width W2. For example, the second width W2 may be a distance (e.g., an average and/or a representative) between neighboring edges of a first internal terminal 53 and a neighboring internal terminal 53. The first pitch P1 may correspond to the sum of the first width W1 and the second width W2. For example, the first pitch P1 may be about 1 to 80 μm. In some embodiments, the first pitch P1 may be about 10 to 25 μm.

Each of the plurality of first internal heat dispersion terminals 54 may include a configuration similar to that of each of the plurality of first internal terminals 53. In some embodiments, each of the plurality of first internal heat dispersion terminals 54 may include a material substantially identical to that of the plurality of first internal terminals 53, and/or may have been formed at substantially the same time and/or under the substantially the same conditions as the plurality of first internal terminals 53. Each of the plurality of first internal heat dispersion terminals 54 may be spaced apart from the plurality of first internal terminals 53. Each of the plurality of first internal heat dispersion terminals 54 may have substantially the same size as each of the plurality of first internal terminals 53. The plurality of first internal heat dispersion terminals 54 and the plurality of first internal terminals 53 may be disposed to have the first pitch P1. In some embodiments, at least one of the plurality of first internal heat dispersion terminals 54 may be connected to the at least one first heat dispersion through electrode 14.

The thermal conductivity of the first high thermal conductivity layer 58 may be 1 W/mK or more. In some embodiments, the thermal conductivity of the first high thermal conductivity layer 58 may be about 1 to 5 W/mK. The first high thermal conductivity layer 58 may include an underfill and/or a liquid encapsulant including a filler and a resin. The filler may include a material having high thermal conductivity. For example, the filler may be and/or include a spherical filler; the spherical filler may increase the flowability of the resin. The filler may include aluminum oxide ($Al_2O_3$), aluminum nitride (AlN), boron nitride (BN), silicon oxide ($SiO_2$), and/or a combination thereof. The spherical filler included in the filler may have a diameter of 0.1 to 10 μm. The diameter of the spherical filler may be selected on the basis of process efficiency. The diameter of the spherical filler may be selected, for example, on the basis of the minimum distance between the wiring structure 10 and the first semiconductor chip 40 and/or flowability of the filler. In some embodiments, the spherical filler may have a diameter of about 0.7 to 3 μm.

In some embodiments, for example when the filler includes the aluminum oxide ($Al_2O_3$), a low α-ray emission grade aluminum oxide (e.g., emission rate: 0.01 CPH/cm$^2$) exhibiting low α-ray emission may be used. The aluminum oxide ($Al_2O_3$) may include an alpha (α) phase, a gamma (γ) phase, a polycrystal, and/or a combination thereof. The resin may include liquid crystalline epoxy resins (LCERs) including, as a backbone structure, multi-aromatics such as biphenyl, naphthyl, anthracenyl, etc. enabling mesogen pi-pi (π-π) stacking thereof. For example, in some embodiments the resin may include YX-4000(K) and/or YX-4000H(K) of Japan Epoxy Resins Company, for biphenyl, and/or may include HP4032D, HP4032SS, etc. of DIC Company, for naphthyl. In some embodiments, the concentration of multi-aromatics in the liquid crystalline epoxy resins (LCERs) may be determined such that the resin is thermally conductive but would not cause an electrical short, for example, in the wiring structure 10.

The high thermal conductivity layer 58 may be between the wiring structure 10 and the first semiconductor chip 40, and/or may extend onto side surfaces of the first semiconductor chip 40. In some embodiments, the first high thermal conductivity layer 58 may completely cover one surface of the wiring structure 10. For example, the first high thermal conductivity layer 58 may completely cover an upper surface of the wiring structure 10. The first high thermal conductivity layer 58 may completely cover a surface (e.g., an upper surface) of the active region 11 and the plurality of scribe lanes SL1 and SL2. The first high thermal conductivity layer 58 may directly contact the active region 11 and the plurality of scribe lanes SL1 and SL2.

An uppermost end of the first high thermal conductivity layer 58 may be formed at a higher level than a lowermost end of the first semiconductor chip 40. The first high thermal conductivity layer 58 may directly contact at least a portion of the side surfaces of the first semiconductor chip 40. For example, the maximum contact height between each side surface of the first semiconductor chip 40 and the first high thermal conductivity layer 58 may be a first length D1. The thickness of the first semiconductor chip 40 may be a second length D2. In some embodiments, the first length D1 may be greater than half of the second length D2. The uppermost end of the first high thermal conductivity layer 58 may be formed at a lower level than an uppermost end of the first semiconductor chip 40. An upper surface of the first high thermal conductivity layer 58 may have various profiles. The upper surface of the first high thermal conductivity layer 58 may include an inclined surface. In some embodiments, the upper surface of the first high thermal conductivity layer 58 may be formed with a level gradually lowering with increasing distance from the first semiconductor chip 40.

The minimum distance between the wiring structure 10 and the first semiconductor chip 40 may be a third length D3. The third length D3 may be 1 to 50 μm. In some embodiments, the third length D3 may be about 10 to 20 μm. The encapsulator 67 may be disposed on the first high thermal conductivity layer 58. In some embodiments, the encapsulator 67 may include an epoxy molding compound. The encapsulator 67 may contact the upper surface of the first high thermal conductivity layer 58 and a portion of the side surfaces of the first semiconductor chip 40.

In some embodiments, side surfaces of the wiring structure 10, the first high thermal conductivity layer 58 and the encapsulator 67 may be substantially coplanar. For example, side surfaces of the first scribe lane SL1, the first high thermal conductivity layer 58, and the encapsulator 67 may be vertically aligned. The side surfaces of the first scribe lane SL1, the first high thermal conductivity layer 58, and the encapsulator 67 may be substantially coplanar. Side surfaces of the second scribe lane SL2, the first high thermal conductivity layer 58, and the encapsulator 67 may be vertically aligned. The side surfaces of the second scribe lane SL2, the first high thermal conductivity layer 58, and the encapsulator 67 may be substantially coplanar. The side surfaces of the wiring structure 10, the first high thermal conductivity layer 58, and the encapsulator 67 may be exposed.

The plurality of first through electrodes 13, the plurality of first internal terminals 53, and/or the plurality of external terminals 63 may be utilized in the driving of the wiring structure 10 and/or the first semiconductor chip 40. For example, plurality of first through electrodes 13, the plurality of first internal terminals 53, and/or the plurality of external terminals 63 may assist in signal transmission, power supply, and/or grounding. The at least one first heat dispersion through electrode 14, the plurality of first internal heat dispersion terminals 54 and the at least one external heat dispersion terminal 64 may disperse and/or externally dissipate heat generated from the wiring structure 10 and the first semiconductor chip 40.

The first high thermal conductivity layer 58 may directly contact the wiring structure 10, the first semiconductor chip 40, the plurality of first internal terminals 53 and the plurality of first internal heat dispersion terminals 54. The first high thermal conductivity layer 58 may disperse and externally dissipate heat generated from the wiring structure 10 and the first semiconductor chip 40.

Figure 2:
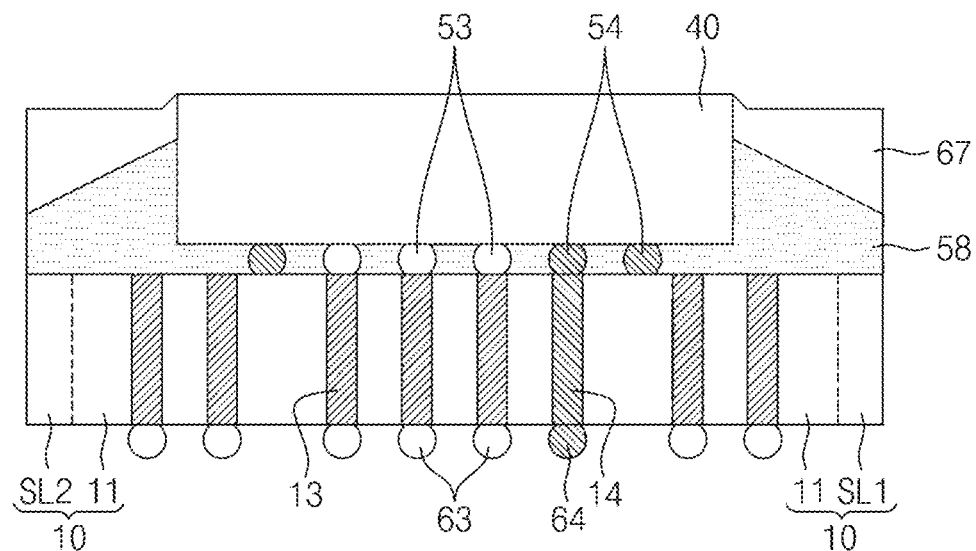
Figure 3:
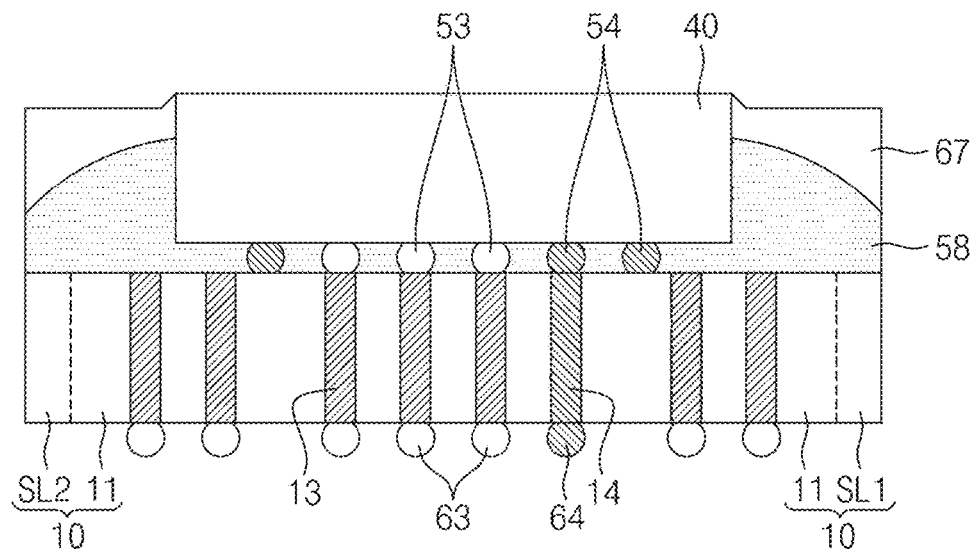
Figure 4:
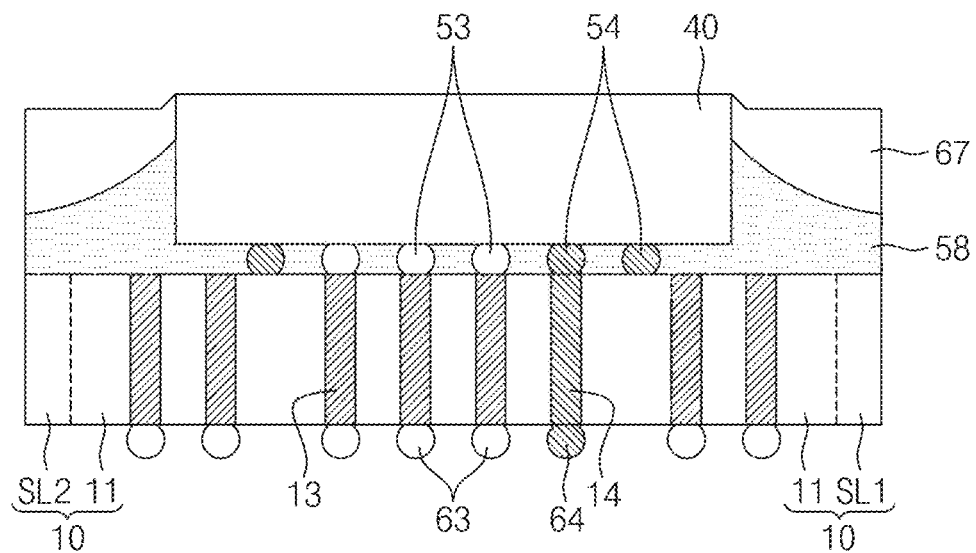

Referring to FIGS. 2 to 4, the upper surface of the first high thermal conductivity layer 58 and the contact surface of the encapsulator 67 may have various profiles. For example, the profile of the upper surface of the first high thermal conductivity layer 58 may be based on of the flowability and formation method of the first high thermal conductivity layer 58. The upper surface of the first high thermal conductivity layer 58 may include an inclined surface. In some embodiments, the upper surface of the first high thermal conductivity layer 58 may include a level gradually lowering with increasing distance from the first semiconductor chip 40.

Figure 5:
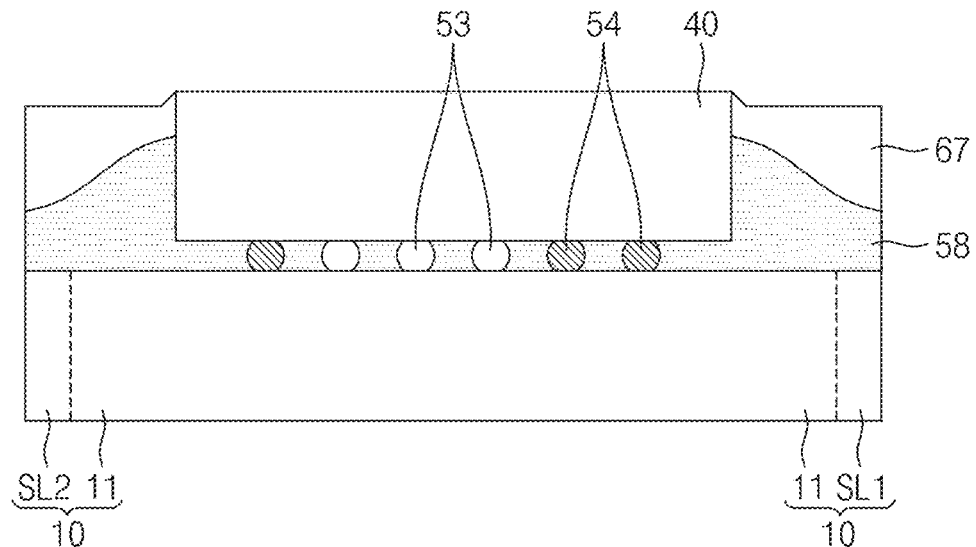

Referring to FIG. 5, the plurality of external terminals ("63" in FIG. 1) and the at least one external heat dispersion terminal ("64" in FIG. 1) may be omitted. In some embodiments, the wiring structure 10 may include a printed circuit board, an interposer substrate, the semiconductor chip, and/or a combination thereof. For example, the wiring structure 10 may include a package substrate and/or a printed circuit board (such as a main board). In some embodiments, the plurality of first through electrodes ("13" in FIG. 1) and the at least one first heat dispersion through electrode ("14" in FIG. 1) may be omitted. In some embodiments, a plurality of horizontal wirings (not shown) and a plurality of vertical wirings (not shown) may be disposed in the active region 11.

Figure 6:
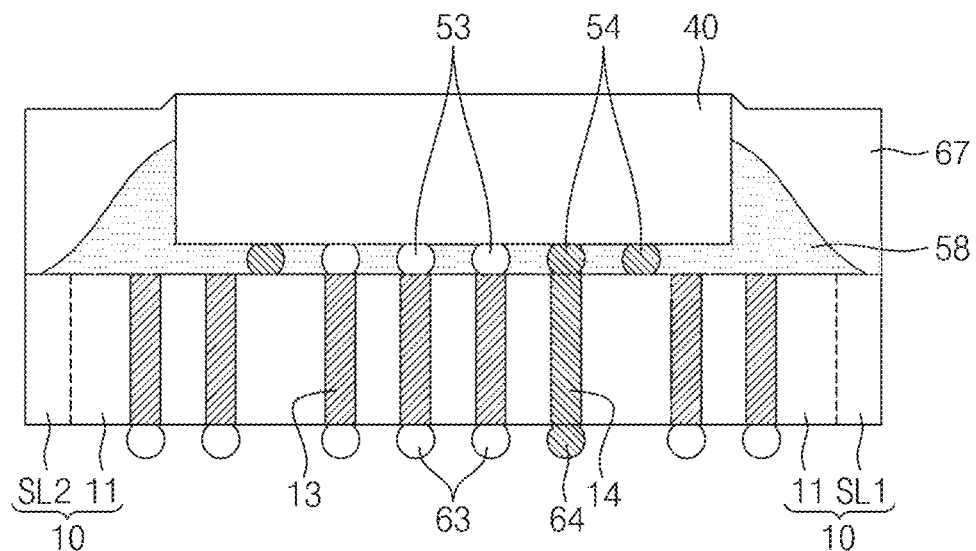

Referring to FIG. 6, a first high thermal conductivity layer 58 may be between an active region 11 and a first semiconductor chip 40, and may extend on a plurality of scribe lanes SL1 and SL2. The first high thermal conductivity layer 58 may directly contact upper surfaces of a first scribe lane SL1 and a second scribe lane SL2. An encapsulator 67 may cover the first high thermal conductivity layer 58 and a wiring structure 10. The encapsulator 67 may directly contact the upper surfaces of the first scribe lane SL1 and the second scribe lane SL2. The encapsulator 67 may, in some embodiments, completely encapsulate the first high thermal conductivity layer 58.

Side surfaces of the wiring structure 10 and the encapsulator 67 may be substantially coplanar. Side surfaces of the first scribe lane SL1 and the encapsulator 67 may be vertically aligned. The side surfaces of the first scribe lane SL1 and the encapsulator 67 may be substantially coplanar. Side surfaces of the second scribe lane SL2 and the encapsulator 67 may be vertically aligned. The side surfaces of the second scribe lane SL2 and the encapsulator 67 may be substantially coplanar.

Figure 7:
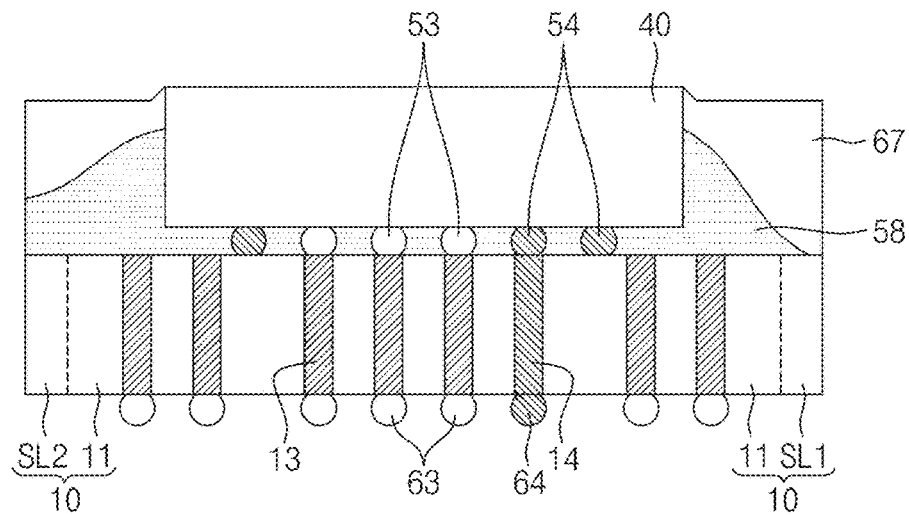

Referring to FIG. 7, a first high thermal conductivity layer 58 may be between an active region 11 and a first semiconductor chip 40, may cover an upper surface of a second scribe lane SL2, and may partially cover an upper surface of a first scribe lane SL1. The first high thermal conductivity layer 58 may directly contact the upper surface of the first scribe lane SL1.

Side surfaces of the first scribe lane SL1 and the encapsulator 67 may be vertically aligned. The side surfaces of the first scribe lane SL1 and the encapsulator 67 may be substantially coplanar. Side surfaces of the second scribe lane SL2, the first high thermal conductivity layer 58, and the encapsulator 67 may be vertically aligned. The side surfaces of the second scribe lane SL2, the first high thermal conductivity layer 58, and the encapsulator 67 may be substantially coplanar.

Figure 8:
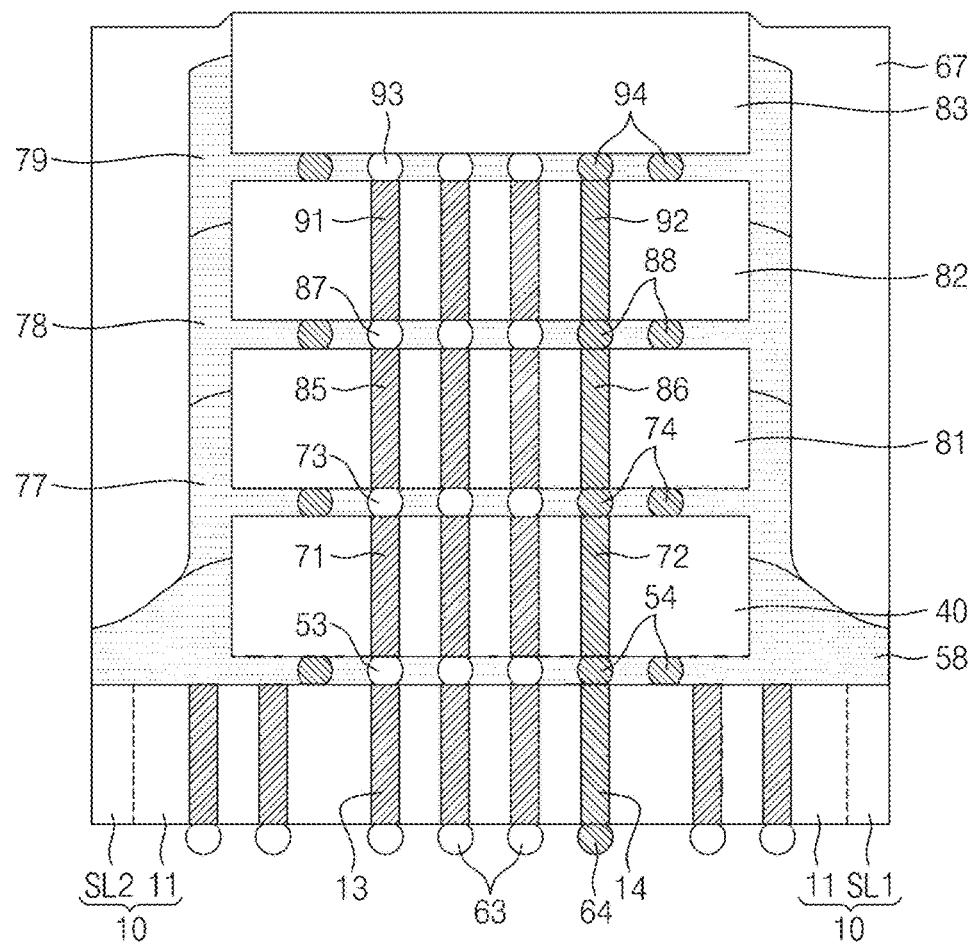

Referring to FIG. 8, a semiconductor package according to some embodiments may include a wiring structure 10, a first semiconductor chip 40, a plurality of first internal terminals 53, a plurality of first internal heat dispersion terminals 54, a first high thermal conductivity layer 58, a second semiconductor chip 81, a plurality of second internal terminals 73, a plurality of second internal heat dispersion terminals 74, a second high thermal conductivity layer 77, a third semiconductor chip 82, a plurality of third internal terminals 87, a plurality of third internal heat dispersion terminals 88, a third high thermal conductivity layer 78, a fourth semiconductor chip 83, a plurality of fourth internal terminals 93, a plurality of fourth internal heat dispersion terminals 94, a fourth high thermal conductivity layer 79, a plurality of external terminals 63, at least one external heat dispersion terminal 64, and an encapsulator 67. Though illustrated as including four semiconductor chips 40, 81, 92, and 83, the semiconductor package is not so limited, and may include, for example, more than or less than the illustrated four semiconductor chips.

In some embodiments, each of the first semiconductor chip 40, the second semiconductor chip 81, the third semiconductor chip 82 and/or the fourth semiconductor chip 83 may include a memory chip, a logic chip, a buffer chip, a controller chip, an application processor chip, an interposer chip, and/or a combination thereof. For example, each of the first semiconductor chip 40, the second semiconductor chip 81, the third semiconductor chip 82 and the fourth semiconductor chip 83 may include the memory chip such as a volatile memory chip, a non-volatile memory chip, and/or a combination thereof. In some embodiments each of the first semiconductor chip 40, the second semiconductor chip 81, the third semiconductor chip 82 and/or the fourth semiconductor chip may include similar and/or different chips.

The first semiconductor 40 may include a plurality of second through electrodes 71 and at least one second heat dispersion through electrode 72, which extend through the first semiconductor chip 40. The second semiconductor chip 81 may include a plurality of third through electrodes 85 and at least one third heat dispersion through electrode 86, which extend through the second semiconductor chip 81. The third semiconductor ship 91 may include plurality of fourth through electrodes 91 and at least one fourth heat dispersion through electrode 92, which extend through the third semiconductor chip 82.

The plurality of second internal terminals 73, the plurality of third internal terminals 87 and/or the plurality of fourth internal terminals 93 may include a configuration similar to that of the plurality of first internal terminals 53. The plurality of second internal heat dispersion terminals 74, the plurality of third internal heat dispersion terminals 88 and/or the plurality of fourth internal heat dispersion terminals 94 may include a configuration similar to that of the plurality of first internal heat dispersion terminals 54.

The plurality of second through electrodes 71, the plurality of third through electrodes 85 and the plurality of fourth through electrodes 91 may include a configuration similar to that of the plurality of first through electrodes 13. The at least one second heat dispersion through electrode 72, the at least one third heat dispersion through electrode 86 and the at least one fourth heat dispersion through electrode 92 may include a configuration similar to that of the at least one first heat dispersion through electrode 14.

Each of the second high thermal conductivity layer 77, the third high thermal conductivity layer 78, and the fourth high thermal conductivity layer 79 may include a configuration similar to that of the first high thermal conductivity layer 58. The second high thermal conductivity layer 77 may be between the first semiconductor chip 40 and the second semiconductor chip 81, and/or may extend on side surfaces of the first semiconductor chip 40 and the second semiconductor chip 81. The second high thermal conductivity layer 77 may directly contact the side surfaces of the first semiconductor chip 40 and the second semiconductor chip 81. The second high thermal conductivity layer 77 may directly contact an upper surface of the first high thermal conductivity layer 58.

The third high thermal conductivity layer 78 may be between the second semiconductor chip 81 and the third semiconductor chip 82, and/or may extend on side surfaces of the second semiconductor chip 81 and the third semiconductor chip 82. The third high thermal conductivity layer 78 may directly contact the side surfaces of the second semiconductor chip 81 and the third semiconductor chip 82. The third high thermal conductivity layer 78 may directly contact an upper surface of the second high thermal conductivity layer 77.

The fourth high thermal conductivity layer 79 may be between the third semiconductor chip 82 and the fourth semiconductor chip 83, and/or may extend on side surfaces of the third semiconductor chip 82 and the fourth semiconductor chip 83. The fourth high thermal conductivity layer 79 may directly contact the side surfaces of the third semiconductor chip 82 and the fourth semiconductor chip 83. The fourth high thermal conductivity layer 79 may directly contact an upper surface of the third high thermal conductivity layer 78.

The encapsulator 67 may cover the first high thermal conductivity layer 58, the second high thermal conductivity layer 77, the third high thermal conductivity layer 78, and/or the fourth high thermal conductivity layer 79. The encapsulator 67 may direct contact side surfaces of the fourth semiconductor chip 83. Though the encapsulator 67 is illustrated as completely encapsulating each of the second high thermal conductivity layer 77, the third high thermal conductivity layer 78, and the fourth high thermal conductivity layer 79, the semiconductor package is not so limited.

The plurality of first internal heat dispersion terminals 54, the plurality of second internal heat dispersion terminals 74, the plurality of third internal heat dispersion terminals 88, the plurality of fourth internal heat dispersion terminals 94, the at least one external heat dispersion terminal 64, the at least one first heat dispersion through electrode 14, the at least one second heat dispersion through electrode 72, the at least one third heat dispersion through electrode 86, and/or the at least one fourth heat dispersion through electrode 92 may disperse and/or externally dissipate heat generated from the wiring structure 10, the first semiconductor chip 40, the second semiconductor chip 81, the third semiconductor chip 82, and/or the fourth semiconductor chip 83. The first high thermal conductivity layer 58, the second high thermal conductivity layer 77, the third high thermal conductivity layer 78, and the fourth high thermal conductivity layer 79 may disperse and/or externally dissipate heat generated from the wiring structure 10, the first semiconductor chip 40, the second semiconductor chip 81, the third semiconductor chip 82, and the fourth semiconductor chip 83.

Figure 12:
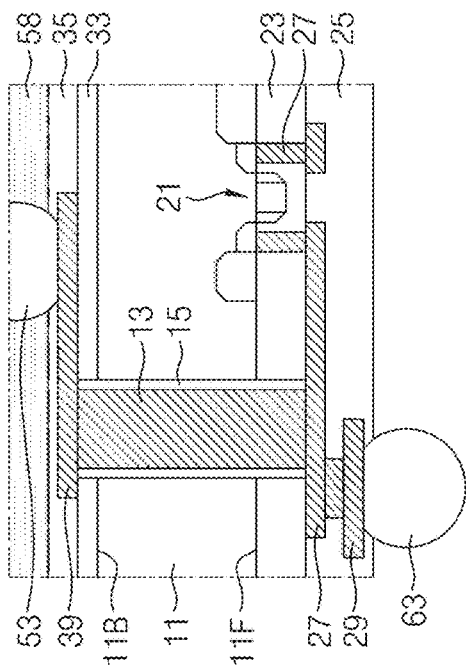
FIGS. 12 and 13 are views showing a portion of FIG. 11.
Figure 13:
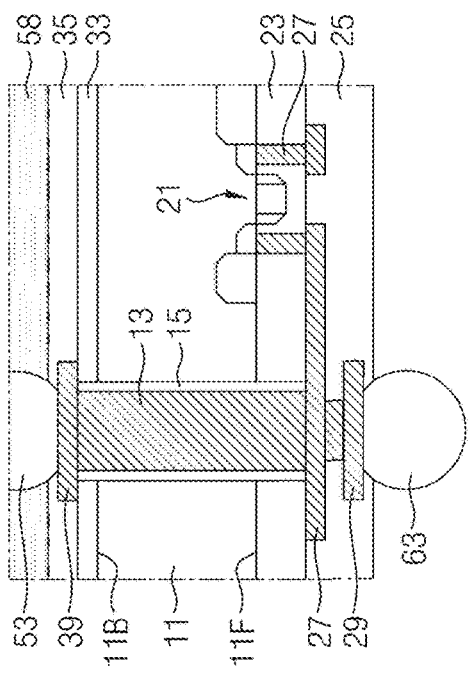

FIGS. 9, 10, 11, 14 and 19 are sectional views of a formation method for a semiconductor package according to some embodiments of the disclosure. FIGS. 12 and 13 are views showing a portion 110 of FIG. 11. FIGS. 15 to 18 are views showing a portion 140 of FIG. 14.

Figure 9:
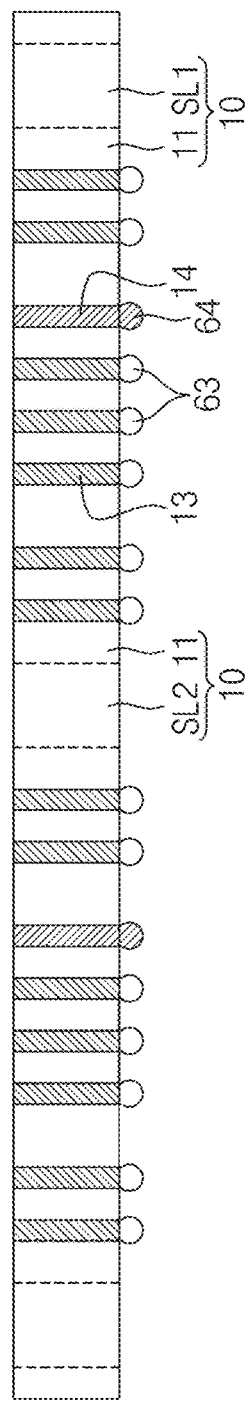
FIGS. 9, 10, 11, 14 and 19 are sectional views of a formation method for a semiconductor package according to some embodiments of the disclosure.

Referring to FIG. 9, a substrate including a plurality of wiring structures 10 having a plurality of scribe lanes SL1 and SL2, which are in continuity with side surfaces of the active regions 11, may be provided. A plurality of first through electrodes 13 and at least one first heat dispersion through electrode 14, which extend through the active region 11, may be formed in the substrate.

A plurality of external terminals 63 and at least one external heat dispersion terminal 64 may be formed on a lower surface of the active region 11. Each of the plurality of external terminals 63 may be electrically connected to a corresponding one of the plurality of first through electrodes 13. The at least one external heat dispersion terminal 64 may be electrically connected to the at least one first heat dispersion through electrode 14.

Figure 10:
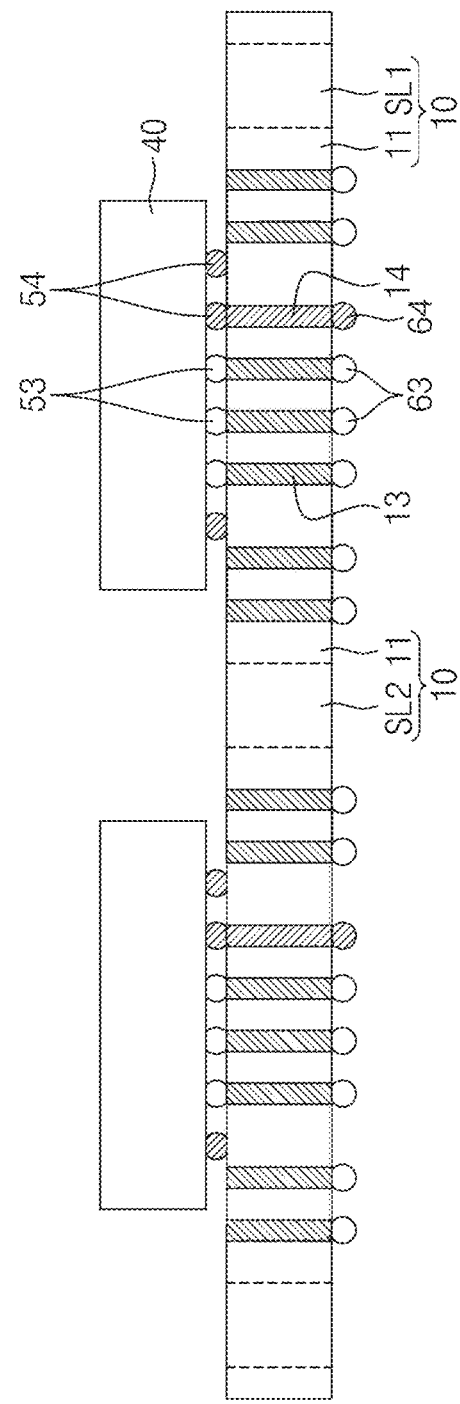

Referring to FIG. 10, a plurality of first semiconductor chip 40 may be mounted on the plurality of wiring structures 10. A plurality of first internal terminals 53 and a plurality of first internal heat dispersion terminals 54 may be formed between the plurality of first semiconductor chips 40 and the plurality of wiring structures 10. The plurality of first internal terminals 53 and the plurality of first internal heat dispersion terminals 54 may contact corresponding ones of the wiring structures 10 and the first semiconductor chips 40. In some embodiments, the formation of the plurality of first internal terminals 53 and the plurality of first internal heat dispersion terminals 54 may include a thermocompression bonding process.

Figure 11:
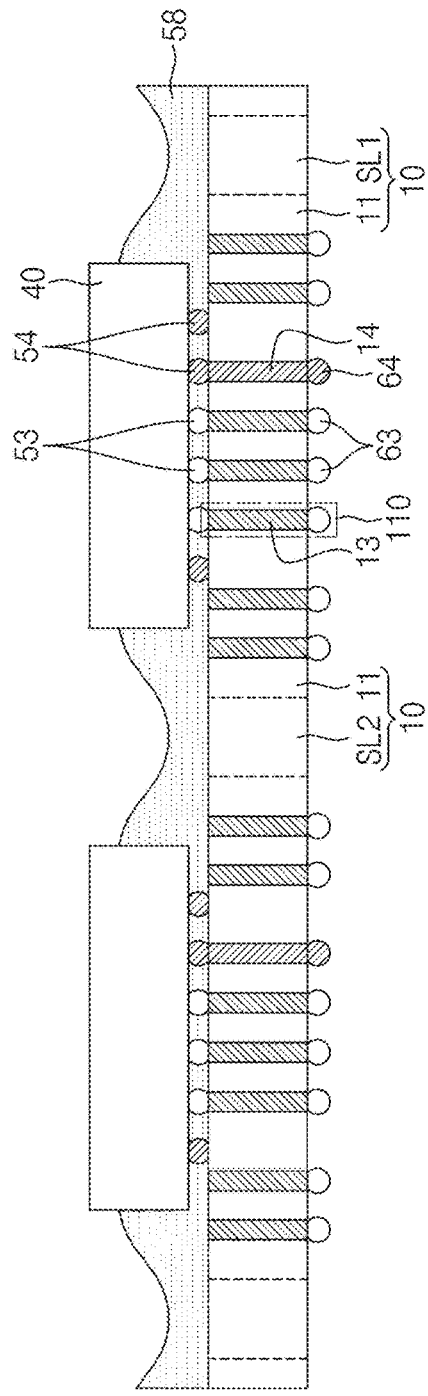

Referring to FIG. 11, a first high thermal conductivity layer 58 may be formed on the plurality of wiring structures 10. The first high thermal conductivity layer 58 may fill a space between the plurality of wiring structures 10 and the plurality of first semiconductor chips 40, and may extend on side surfaces of the plurality of first semiconductor chips 40. In some embodiments, the first high thermal conductivity layer 58 may include a resin with a high degree of wetting and/or adhesion with the outer surface of the first semiconductor chip 40 when in a liquid phase. The first high thermal conductivity layer 58 may completely cover the plurality of scribe-lanes SL1 and SL2. An upper surface of the first high thermal conductivity layer 58 may have various profiles on the basis of the flowability and formation method of the first high thermal conductivity layer 58.

Referring to FIG. 12, the active region 11 may include a first surface 11F, and a second surface 11B opposite to the first surface 11F. The first surface 11F may correspond to a front (e.g., bottom) surface, and the second surface 11B may correspond to a back (e.g., top) surface. A first insulating layer 23 and a second insulating layer 25 may be sequentially stacked on the first surface 11F. Various kinds of active elements (such as a transistor 21) may be formed adjacent to and/or in the first surface 11F.

In some embodiments, the transistor 21 may be formed in an interior of the active region 11 and/or in the first insulating layer 23. The transistor 21 may include a fin field effect transistor (finFET), a multi-bridge channel transistor (MBCT) (such as MBCFET®), a nano-wire transistor, a vertical transistor, a recess channel transistor, a 3-D transistor, a planar transistor, and/or a combination thereof.

A third insulating layer 33 and a fourth insulating layer 35 may be sequentially stacked on the second surface 11B. The first high thermal conductivity layer 58 may be formed on the fourth insulating layer 35. A first through electrode 13, which extends through the active region 11, the first insulating layer 23, and the third insulating layer 33, may be formed. An insulating spacer 15 surrounding a side surface of the first through electrode 13 may be formed.

A plurality of internal wirings 27 and at least one first pad 29 may be formed in the first insulating layer 23 and/or the second insulating layer 25. The plurality of internal wirings 27 may include a plurality of horizontal wirings and a plurality of vertical wirings. An external terminal 63 may be formed on the second insulating layer 25. The external terminal 63 may extend into the second insulating layer 25 such that the external terminal 63 contacts the first pad 29. Some of the plurality of internal wirings 27 may be connected to the first pad 29 and the first through electrode 13. Some of the plurality of internal wirings 27 may be connected to the transistor 21.

A second pad 39 may be formed in the fourth insulating layer 35. The second pad 39 may be connected to the first through electrode 13. A first internal terminal 53 may be formed on the fourth insulating layer 35. The first internal terminal 53 may extend through the first high thermal conductivity layer 58 and the fourth insulating layer 35 such that the first internal terminal 53 contacts the second pad 39.

The external terminal 63 may be connected to the first internal terminal 53 via the first pad 29, the plurality of internal wirings 27, the first through electrode 13, and the second pad 39. The external terminal 63 may be connected to the transistor 21 via the first pad 29 and the plurality of internal wirings 27. In some embodiments, the external terminal 63, the first through electrode 13, and the first internal terminal 53 may be vertically aligned.

Each of the first through electrode 13, the plurality of internal wirings 27, the first pad 29, and the second pad 39 may include a single layer and/or multiple layers. Each of the first through electrode 13, the plurality of internal wirings 27, the first pad 29 and the second pad 39 may include a conductive material such as a metal (e.g., Cu, W, Ni, Co, Al, Ti, Ta, Ag, Pt, Au, Ru, Cr, Sn, and/or a combination thereof); a conductive oxide; a conductive nitride (e.g., WN, TiN, TaN, and/or a combination thereof); and/or a combination thereof.

Each of the insulating spacer 15, the first insulating layer 23, the second insulating layer 25, the third insulating layer 33, and the fourth insulating layer 35 may include a single layer and/or multiple layers. Each of the insulating spacer 15, the first insulating layer 23, the second insulating layer 25, the third insulating layer 33, and the fourth insulating layer 35 may include an insulating material such as silicon oxide, silicon nitride, silicon oxynitride, low-K dielectrics, high-K dielectrics, and/or a combination thereof.

Referring to FIG. 13, at least one of the external terminal 63 and the first internal terminal 53 may be misaligned from the first through electrode 13. For example, straight lines perpendicular to the first surface 11F (e.g., while passing through centers of the external terminal 63, the first through electrode 13 and the first internal terminal 53, respectively) may extend in parallel.

Figure 14:
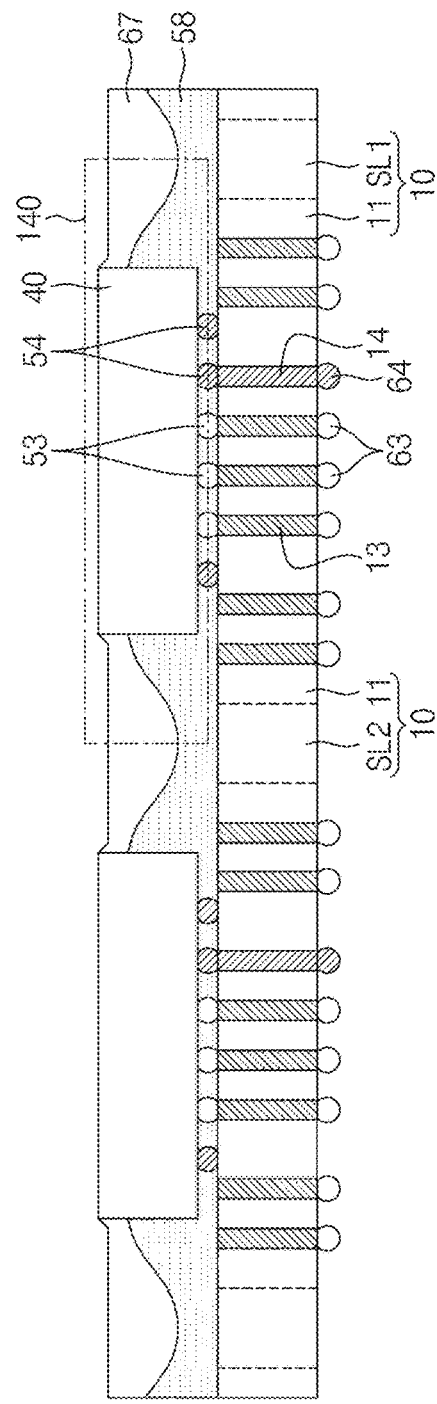

Referring to FIG. 14, an encapsulator 67 may be formed on the first high thermal conductivity layer 58. The encapsulator 67 may include an epoxy molding compound. The encapsulator 67 may contact side surfaces of the plurality of first semiconductor chips 40.

Figure 15:
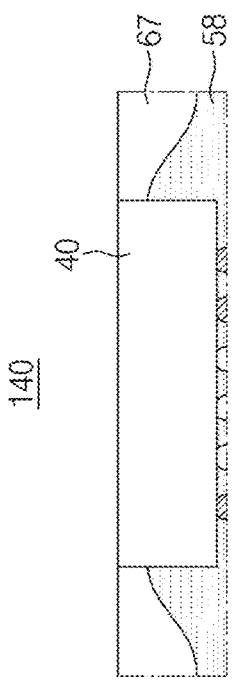
FIGS. 15 to 18 are views showing a portion of FIG. 14.

Referring to FIG. 15, an upper surface of the encapsulator 67 may be formed at a level equal to or lower than an upper surface of the first semiconductor chip 40. The upper surface of the first semiconductor chip 40 may be exposed.

Figure 16:
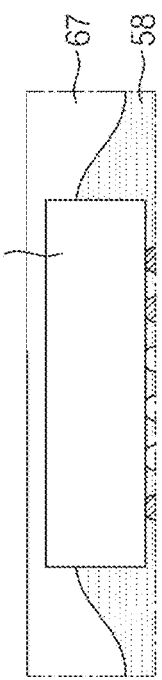

Referring to FIG. 16, the upper surface of the encapsulator 67 may be formed at substantially the same level as the upper surface of the first semiconductor chip 40. The upper surfaces of the encapsulator 67 and the first semiconductor chip 40 may be exposed at substantially the same level.

Figure 17:
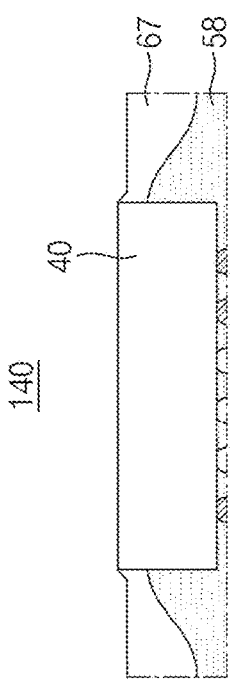

Referring to FIG. 17, the upper surface of the encapsulator 67 may be formed at a higher level than the upper surface of the first semiconductor chip 40.

Figure 18:
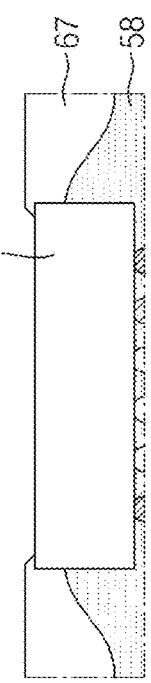

Referring to FIG. 18, the encapsulator 67 may be formed to completely cover upper surfaces of the first semiconductor chip 40 and the first high thermal conductivity layer 58.

Figure 19:
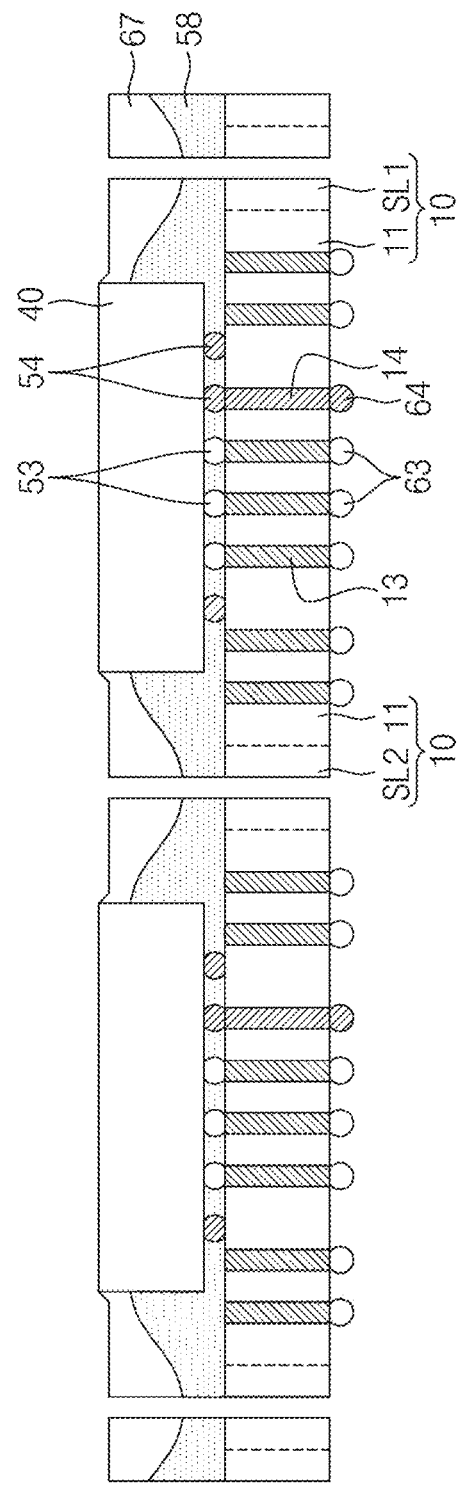

Referring to FIG. 19, the plurality of scribe lanes SL1 and SL2 may be cut using a sawing process.

In accordance with some example embodiments of the disclosure, a high thermal conductivity layer, which includes a portion between a wiring structure and a semiconductor chip and extends on a scribe lane of the wiring structure, is provided. The high thermal conductivity layer may be configured to disperse and externally dissipate heat generated from the wiring structure and the semiconductor chip. Thus, a semiconductor package having efficient heat dissipation characteristics may be realized.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
a wiring structure;
a first semiconductor chip on the wiring structure;
a plurality of internal terminals between the wiring structure and the first semiconductor chip;
a high thermal conductivity layer between the wiring structure and the first semiconductor chip; and
an encapsulator on the high thermal conductivity layer and contacting the first semiconductor chip,
wherein sidewalls of at least the wiring structure and the encapsulator are substantially coplanar,
at least one sidewall of the high thermal conductivity layer is coplanar to at least one of the coplanar sidewalls of the wiring structure and the encapsulator,
the high thermal conductivity layer contacts a side surface of the first semiconductor chip,
a maximum contact height between the high thermal conductivity layer and the first semiconductor chip is a first length,
a height of the first semiconductor chip is a second length,
the first length is greater than half of the second length, and
an upper surface of the encapsulator includes a flat portion substantially parallel to an upper surface of the wiring structure and an inclined portion between the flat portion and the first semiconductor chip.

2. The semiconductor package according to claim 1, wherein a thermal conductivity of the high thermal conductivity layer is 1 to 5 W/mK.

3. The semiconductor package according to claim 1, wherein:

the high thermal conductivity layer comprises a filler and a resin; and the filler comprises aluminum oxide ($Al_2O_3$), aluminum nitride (AlN), boron nitride (BN), silicon oxide ($SiO_2$), or a combination thereof.

4. The semiconductor package according to claim 3, wherein the filler includes a spherical filler with a diameter of 0.7 to 3 μm.

5. The semiconductor package according to claim 3, wherein the resin comprises liquid crystalline epoxy resins (LCERs).

6. The semiconductor package according to claim 1, wherein:
the wiring structure comprises
an active region, and
at least one scribe lane in continuity with a side surface of the active region; and
the high thermal conductivity layer contacts the active region and the at least one scribe lane.

7. The semiconductor package according to claim 6, wherein a side wall of the at least one scribe lane is substantially coplanar to the at least one sidewall of the high thermal conductivity layer substantially coplanar to the sidewall of the encapsulator.

8. The semiconductor package according to claim 1, wherein
an uppermost end of the high thermal conductivity layer is at a higher level than a lowermost end of the first semiconductor chip; and
the uppermost end of the high thermal conductivity layer is at a lower level than an uppermost end of the first semiconductor chip.

9. The semiconductor package according to claim 1, wherein
an upper surface of the high thermal conductivity layer comprises an inclined surface; and
a height of the upper surface of the high thermal conductivity layer decreases with increasing distance from the first semiconductor chip.

10. The semiconductor package according to claim 1, wherein the plurality of internal terminals extends through the high thermal conductivity layer, and contacts the wiring structure and the first semiconductor chip.

11. The semiconductor package according to claim 10, further comprising:
a plurality of through electrodes extending through the wiring structure, the plurality of through electrodes connected to the plurality of internal terminals; and
a plurality of external terminals on a lower surface of the wiring structure and connected to the plurality of through electrodes.

12. The semiconductor package according to claim 10, further comprising:
a plurality of internal heat dispersion terminals spaced apart from the plurality of internal terminals, the plurality of internal heat dispersion terminals extending through the high thermal conductivity layer and contacting the wiring structure and the first semiconductor chip.

13. The semiconductor package according to claim 12, further comprising:
at least one heat dispersion through electrode extending through the wiring structure, the at least one heat dispersion through electrode connected to the plurality of internal heat dispersion terminals; and
at least one external heat dispersion terminal on a lower surface of the wiring structure, the at least one external heat dispersion terminal connected to the at least one heat dispersion through electrode.

14. A semiconductor package comprising:
a wiring structure comprising an active region and a plurality of scribe lanes in continuity with side surfaces of the active region;
a semiconductor chip on the wiring structure;
a plurality of internal terminals between the wiring structure and the semiconductor chip;
a high thermal conductivity layer between the wiring structure and the semiconductor chip, the high thermal conductivity layer contacting the active region and the plurality of scribe lanes; and
an encapsulator on the wiring structure and the high thermal conductivity layer and contacting the semiconductor chip, the encapsulator including an upper surface at a different height compared to an upper surface of the semiconductor chip,
wherein the high thermal conductivity layer contacts a side surface of the semiconductor chip,
a maximum contact height between the high thermal conductivity layer and the semiconductor chip is a first length,
a height of the semiconductor chip is a second length,
the first length is greater than half of the second length, and
an upper surface of the encapsulator includes a flat portion substantially parallel to an upper surface of the wiring structure and an inclined portion between the flat portion and the semiconductor chip.

15. The semiconductor package according to claim 14, wherein
the encapsulator contacts at least one of the plurality of scribe lanes; and
sidewalls of at least one of the plurality of scribe lanes and the encapsulator are substantially coplanar.

16. The semiconductor package according to claim 14, wherein sidewalls of at least one of the plurality of scribe lanes, the high thermal conductivity layer, and the encapsulator are substantially coplanar.

17. The semiconductor package according to claim 14, wherein a thermal conductivity of the high thermal conductivity layer is 1 to 5 W/mK.

18. The semiconductor package according to claim 14, wherein
an uppermost end of the high thermal conductivity layer is at a higher level than a lowermost end of the semiconductor chip; and
the uppermost end of the high thermal conductivity layer is at a lower level than an uppermost end of the semiconductor chip.

19. A semiconductor package comprising:
a wiring structure;
a semiconductor chip on the wiring structure;
a plurality of internal terminals between the wiring structure and the semiconductor chip;
a high thermal conductivity layer between the wiring structure and the semiconductor chip; and
an encapsulator on the high thermal conductivity layer and contacting the semiconductor chip,
wherein sidewalls of at least the wiring structure and the encapsulator are substantially coplanar,
at least one sidewall of the high thermal conductivity layer is coplanar to at least one of the coplanar sidewalls of the wiring structure and the encapsulator, wherein an uppermost end of the high thermal conductivity layer is at a higher level than a lowermost end of the semiconductor chip,
wherein the uppermost end of the high thermal conductivity layer is at a lower level than an uppermost end of the semiconductor chip,
wherein the high thermal conductivity layer directly contacts a side surface of the semiconductor chip,
a maximum contact height between the high thermal conductivity layer and the semiconductor chip is a first length, a height of the semiconductor chip is a second length, and the first length is greater than half of the second length, and
an upper surface of the encapsulator includes a flat portion substantially parallel to an upper surface of the wiring structure and an inclined portion between the flat portion and the semiconductor chip.

* * * * *